United States Patent
Tanabe

(10) Patent No.: US 7,052,944 B2
(45) Date of Patent: May 30, 2006

(54) THIN-FILM TRANSISTOR AND METHOD OF MANUFACTURE THEREOF

(75) Inventor: Hiroshi Tanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 158 days.

(21) Appl. No.: 10/311,968

(22) PCT Filed: May 25, 2001

(86) PCT No.: PCT/JP01/04402

§ 371 (c)(1),
(2), (4) Date: Dec. 23, 2002

(87) PCT Pub. No.: WO01/99199

PCT Pub. Date: Dec. 27, 2001

(65) Prior Publication Data

US 2003/0096462 A1 May 22, 2003

(30) Foreign Application Priority Data

Jun. 23, 2000 (JP) ............................. 2000-188727

(51) Int. Cl.
*H01L 21/84* (2006.01)
*H01L 29/76* (2006.01)

(52) U.S. Cl. ..................... 438/166; 438/657; 257/66; 257/755

(58) Field of Classification Search ............... 257/316; 438/151, 166, 479, 585
See application file for complete search history.

(56) References Cited

U.S. PATENT DOCUMENTS

| | | | | |
|---|---|---|---|---|
| 4,339,285 A | * | 7/1982 | Pankove | 438/663 |
| 4,467,519 A | * | 8/1984 | Glang et al. | 438/330 |
| 4,579,600 A | * | 4/1986 | Shah et al. | 438/385 |
| 5,031,010 A | * | 7/1991 | Mikata et al. | 257/316 |
| 5,242,530 A | * | 9/1993 | Batey et al. | 117/90 |
| 5,254,208 A | * | 10/1993 | Zhang | 438/479 |
| 5,313,076 A | * | 5/1994 | Yamazaki et al. | 257/66 |
| 5,581,102 A | * | 12/1996 | Kusumoto | 257/347 |
| 5,589,233 A | * | 12/1996 | Law et al. | 427/579 |
| 5,612,236 A | * | 3/1997 | Mikata et al. | 438/198 |
| 5,652,156 A | * | 7/1997 | Liao et al. | 438/161 |
| 5,670,793 A | * | 9/1997 | Miura et al. | 257/64 |
| 5,691,228 A | * | 11/1997 | Ping et al. | 438/255 |
| 5,767,004 A | * | 6/1998 | Balasubramanian et al. | 438/592 |

(Continued)

FOREIGN PATENT DOCUMENTS

JP 60-109282 6/1985

(Continued)

OTHER PUBLICATIONS

90113334, IEEE Transactions on Electron Devices, vol. 42, Aug. 1995, "Suppression of Boron Penetration in BF2-Implanted P-Type Gate MOSFET by Trapping of FLuorines in Amorphous Gate".

*Primary Examiner*—Chandra Chaudhan
(74) *Attorney, Agent, or Firm*—Young & Thompson

(57) ABSTRACT

A thin-film transistor is provided which prevents the degradation of transistor characteristics due to ion channeling. A thin-film transistor (10) includes thin crystalline silicon (2) including source and drain regions (2a) and a channel region (2b), which are formed on a substrate (1); a gate insulator (3) formed on the crystalline silicon (2); and a gate electrode (4) formed on the gate insulator (3). The gate electrode (4) includes an amorphous layer (5) and a crystalline layer (6).

19 Claims, 15 Drawing Sheets

1 : INSULATING SUBSTRATE
2 : CRYSTALLIZED SILICON THIN FILM
2a : SOURCE AND DRAIN REGIONS
2b : CHANNEL REGION
3 : GATE INSULATING FILM
4 : GATE ELECTRODE
5 : LOWER GATE SILICON LAYER (AMORPHOUS LAYER)
6 : UPPER GATE SILICON LAYER (CRYSTALLINE LAYER)
7 : GATE METAL LAYER
10 : THIN FILM TRANSISTOR

U.S. PATENT DOCUMENTS

| | | | | |
|---|---|---|---|---|
| 5,773,309 | A * | 6/1998 | Weiner | 438/166 |
| 5,869,389 | A * | 2/1999 | Ping et al. | 438/486 |
| 5,956,603 | A * | 9/1999 | Talwar et al. | 438/520 |
| 6,063,654 | A * | 5/2000 | Ohtani | 438/166 |
| 6,096,626 | A * | 8/2000 | Smith et al. | 438/478 |
| 6,150,251 | A * | 11/2000 | Yew et al. | 438/592 |
| 6,162,716 | A * | 12/2000 | Yu et al. | 438/592 |
| 6,392,280 | B1 * | 5/2002 | Besser et al. | 257/410 |
| 6,455,400 | B1 * | 9/2002 | Smith et al. | 438/482 |
| 6,468,845 | B1 * | 10/2002 | Nakajima et al. | 438/166 |
| 6,573,193 | B1 * | 6/2003 | Yu et al. | 438/770 |
| 6,689,675 | B1 * | 2/2004 | Parker et al. | 438/585 |
| 6,743,680 | B1 * | 6/2004 | Yu | 438/285 |
| 6,790,791 | B1 * | 9/2004 | Ahn et al. | 438/783 |

FOREIGN PATENT DOCUMENTS

| | | |
|---|---|---|
| JP | 2-25072 | 1/1990 |
| JP | 2-130912 | 5/1990 |
| JP | 2-277244 | 11/1990 |
| JP | 3-33434 | 2/1991 |
| JP | 3-55850 | 3/1991 |
| JP | 6-163401 | 6/1994 |
| JP | 6-177372 | 6/1994 |
| JP | 6-267980 | 9/1994 |
| JP | 6-275805 | 9/1994 |
| JP | 8-248441 | 9/1996 |
| JP | 10-172919 | 6/1998 |
| JP | 2822394 | 9/1998 |
| JP | 11-307777 | 11/1999 |
| KR | 1998-016818 | 6/1998 |

* cited by examiner

1 : INSULATING SUBSTRATE
2 : CRYSTALLIZED SILICON THIN FILM
2a : SOURCE AND DRAIN REGIONS
2b : CHANNEL REGION
3 : GATE INSULATING FILM
4 : GATE ELECTRODE
5 : LOWER GATE SILICON LAYER
   (AMORPHOUS LAYER)
6 : UPPER GATE SILICON LAYER
   (CRYSTALLINE LAYER)
7 : GATE METAL LAYER
10 : THIN FILM TRANSISTOR

11 : INSULATING SUBSTRATE
12 : CRYSTALLIZED SILICON THIN FILM
12a : SOURCE AND DRAIN REGIONS
12b : CHANNEL REGION
13 : GATE INSULATING FILM
14 : GATE ELECTRODE
15 : LOWER GATE SILICON LAYER (AMORPHOUS LAYER)
16 : UPPER GATE SILICON LAYER (CRYSTALLINE LAYER)
17 : CONTACT HOLE
18 : INSULATING INTERLAYER
19 : METAL WIRING LAYER
20 : THIN FILM TRANSISTOR

FIG.3

| | | SHEET RESISTANCE (Ω/□) | RESISTIVITY (Ω/cm) |
|---|---|---|---|
| FILM THICKNESS (nm) | 40.7 | >1×10⁶ | >5 |
| | 68.5 | 2.3×10⁵ | 1.73 |
| | 104.6 | 2.5×10⁴ | 0.25 |

FIG.4A

|  |  | COMPONENT (%) | | |
|---|---|---|---|---|
|  |  | AMORPHOUS SILICON | CRYSTALLINE SILICON | VOID |
| FILM THICKNESS (nm) | UPPER LAYER 27.6 | 64 | 14 | 22 |
|  | LOWER LAYER 13.1 | 100 | 0 | 0 |

FIG.4B

|  |  | COMPONENT (%) | | |
|---|---|---|---|---|
|  |  | AMORPHOUS SILICON | CRYSTALLINE SILICON | VOID |
| FILM THICKNESS (nm) | UPPER LAYER 41.4 | 31 | 49 | 20 |
|  | LOWER LAYER 27.1 | 79 | 0 | 21 |

FIG.4C

|  |  | COMPONENT (%) | | |
|---|---|---|---|---|
|  |  | AMORPHOUS SILICON | CRYSTALLINE SILICON | VOID |
| FILM THICKNESS (nm) | UPPER LAYER 62.5 | 10 | 60 | 30 |
|  | LOWER LAYER 42.1 | 70 | 0 | 30 |

21 : INSULATING SUBSTRATE
21a : GLASS SUBSTRATE
21b : SUBSTRATE COVER FILM
22 : CRYSTALLIZED SILICON THIN FILM
22a : SOURCE AND DRAIN REGIONS
22b : CHANNEL REGION
23A : FIRST GATE INSULATING FILM
23B : SECOND GATE INSULATING FILM
24 : GATE ELECTRODE
25 : GATE SILICON LAYER
26 : GATE METAL LAYER
27 : CONTACT HOLE
28 : INSULATING INTERLAYER
29 : METAL WIRING LAYER
30 : THIN FILM TRANSISTOR

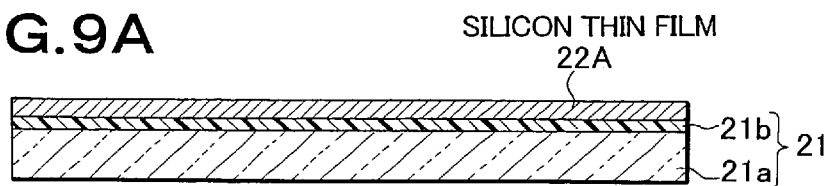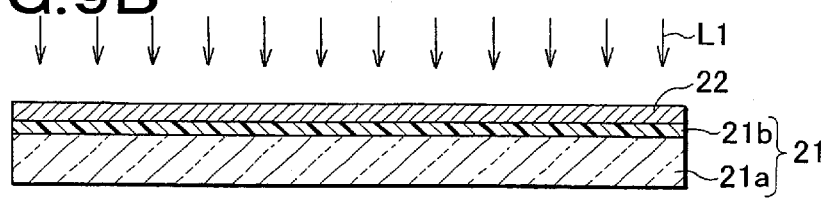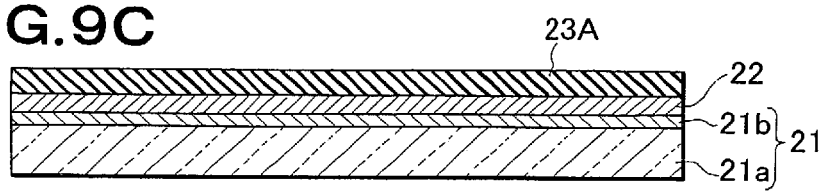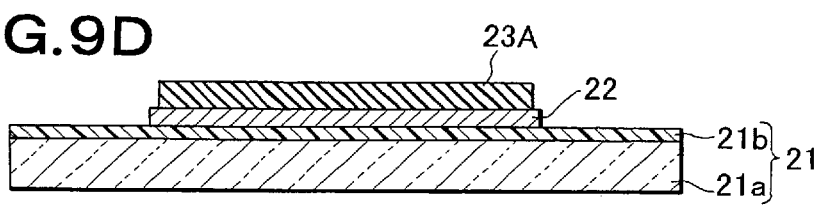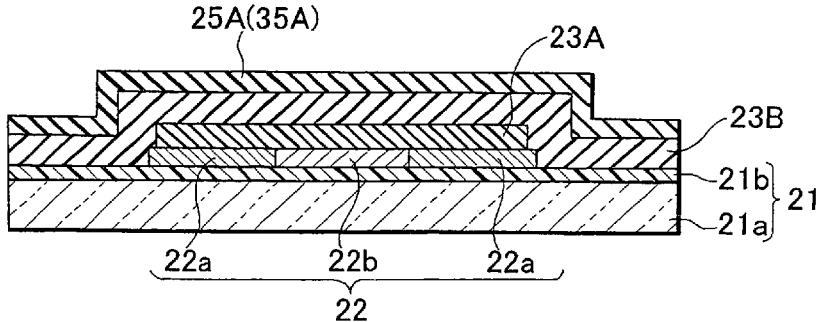

31 : INSULATING SUBSTRATE
31a : GLASS SUBSTRATE
31b : SUBSTRATE COVER FILM
32 : CRYSTALLIZED SILICON THIN FILM
32a : SOURCE AND DRAIN REGIONS
32b : CHANNEL REGION
33A : FIRST GATE INSULATING FILM
33B : SECOND GATE INSULATING FILM
34 : GATE ELECTRODE
37 : CONTACT HOLE
38 : INSULATING INTERLAYER
39 : METAL WIRING LAYER
40 : THIN FILM TRANSISTOR

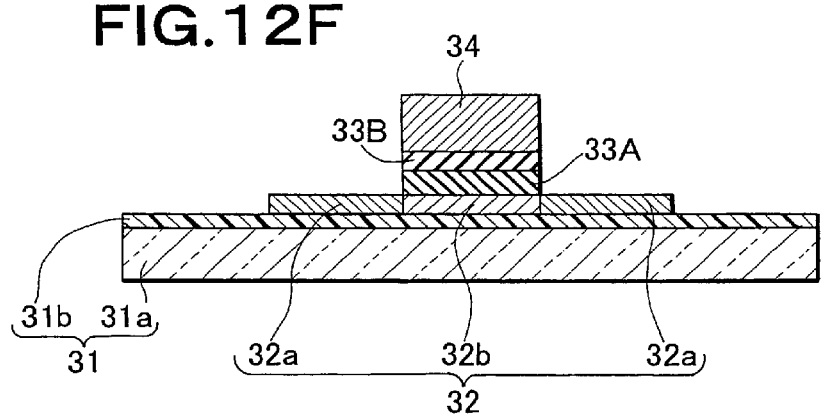
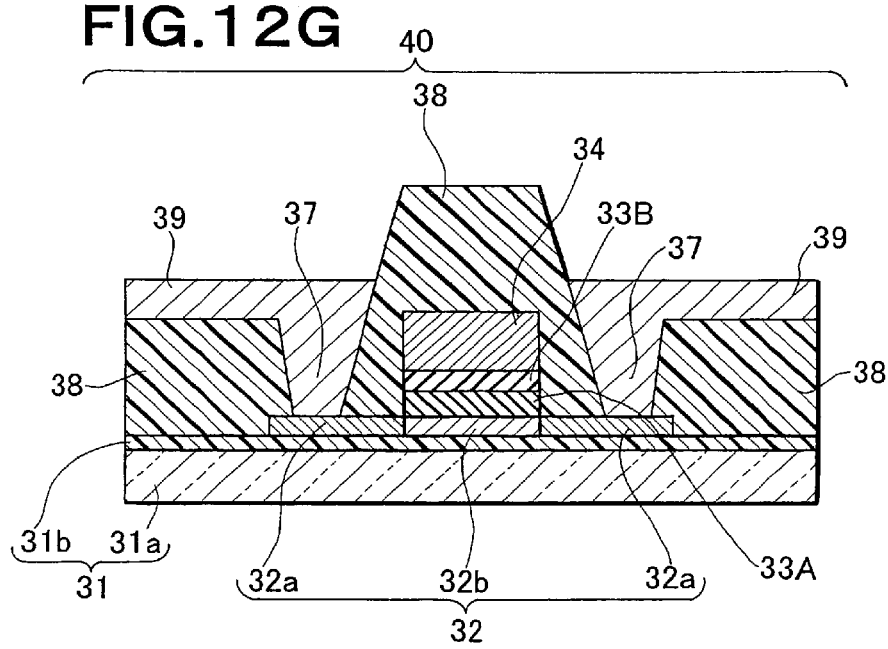

MEM1 : WORD LINE
MEM2 : STORAGE CELL
MEM3 : BIT LINE
MEM4 : COLUMN DECODER
MEM5 : ROW DECODER
MEM6 : AMPLIFIER/DRIVER
MEM7 : COLUMN ADDRESS
MEM8 : ROW ADDRESS
MEM9 : DATA

LCV1 : DATA DRIVER
LCV2 : GATE DRIVER
LCV3 : ACTIVE MATRIX ARRAY
LCV4 : PIXEL
LCV5 : LIQUID CRYSTAL DISPLAY
LCV6 : DATA
LCV7 : PROJECTOR
LCV8 : HALOGEN LAMP
LCV9 : DICHROIC MIRROR
LCV10 : LIGHT VALVE
LCV11 : RED COMPONENT
LCV12 : GREEN COMPONENT
LCV13 : BLUE COMPONENT
LCV14 : PROJECTION LENS
LCV15 : SCREEN

LCV1 : DATA DRIVER
LCV2 : GATE DRIVER
LCV3 : ACTIVE MATRIX ARRAY
LCV4 : PIXEL
LCV5 : LIQUID CRYSTAL DISPLAY
LCV6 : DATA
LCV7 : PROJECTOR
LCV8 : HALOGEN LAMP
LCV9 : DICHROIC MIRROR
LCV10 : LIGHT VALVE
LCV11 : RED COMPONENT
LCV12 : GREEN COMPONENT
LCV13 : BLUE COMPONENT
LCV14 : PROJECTION LENS
LCV15 : SCREEN

THIN-FILM TRANSISTOR AND METHOD OF MANUFACTURE THEREOF

FIELD OF THE INVENTION

The present invention relates to a thin film transistor formed on an insulator and used as a constituent element of a semiconductor device such as a memory or a CPU or a functional device such as a display, a sensor or a printing device, and a method of manufacturing the thin film transistor.

DESCRIPTION OF THE RELATED ART

Conventionally, as typical examples of a thin film transistor (TFT) formed on an insulating substrate such as glass or quartz, a hydride amorphous silicon TFT and a polycrystalline silicon TFT are known.

Of these TFTs, the hydride amorphous silicon TFT can be manufactured under a condition of maximum temperature of about 300° C. by using an inexpensive low-melting-point glass substrate as an insulating substrate. In addition, as a mobility, a carrier mobility of about 1 $cm^2/V \cdot sec$ can be realized.

The hydride amorphous silicon TFT is used as a switching transistor of each pixel in an active matrix liquid crystal display (hereinafter referred to as an "active matrix LCD"), and is driven by a driver integrated circuit (IC, an LSI or the like formed on a single-crystal silicon substrate) arranged around the pixel. In this case, the hydride amorphous silicon TFT is arranged to each pixel.

Therefore, as compared with a passive matrix LCD in which an electric signal for driving a liquid crystal is transmitted from a peripheral driver integrated circuit, the active matrix LCD has advantages that cross talk or the like can be reduced to obtain preferable image quality.

In the polycrystalline silicon TFT, for example, a quartz substrate is used as an insulating substrate, a high-temperature process of about 1,000° C. equal to the temperature of a process of manufacturing an LSI is used, so that performance having a carrier mobility of 30 to 100 $cm^2/V \cdot sec$ can be obtained.

A case in which the polycrystalline silicon TFT is applied to a liquid crystal display will be described below. The polycrystalline silicon TFT is formed by a high-temperature process of about 1,000° C. equal to the temperature of a process of manufacturing an LSI as described above, and can realize a high calmer mobility. In this manner, polycrystalline silicon TFTs for driving respective pixels and a peripheral drive circuit section (e.g., LSI) can be simultaneously formed on the same insulating substrate, and the liquid crystal display can be easily made smaller as compared with a case of the active matrix LCD.

More specifically in an active matrix LCD, a substrate and a peripheral driver integrated circuit are connected to each other by using a tab connection method or a wire bonding method. For this reason, in the active matrix LCD, in accordance with a reduction in size or an increase in resolution, a connection pitch between the substrate and the peripheral driver integrated circuit decreases, and the connection cannot be easily achieved. In contrast to this, in the liquid crystal display using the polycrystalline silicon TFT, since the polycrystalline silicon TFTs and the peripheral drive circuit section can be simultaneously formed on the same insulating substrate as described above. For this reason, the liquid crystal display can be easily reduced in size.

That is, the polycrystalline silicon TFT can contribute to a reduction in manufacturing cost and a reduction in size in a process of manufacturing a liquid crystal display. For example, as a liquid crystal display using the polycrystalline silicon TFT, a liquid crystal light bulb used in a liquid crystal projector. In the liquid crystal light bulb, a drive-circuit-integrated display element corresponding to a resolution of 1,000 dpi (dop per inch) is realized.

However, since the polycrystalline silicon TFT is manufactured by the high-temperature process of about 1,000° C. as described above, an inexpensive low-melting-point glass substrate which can be used in an active matrix LCD cannot be used, and an expensive quartz substrate is inevitably used. That is, a liquid crystal display using an inexpensive low-melting-point glass substrate and a polycrystalline silicon TFT cannot be easily formed. Therefore, a temperature in the process of manufacturing a polycrystalline silicon TFT must be reduced to use a low-melting-point glass substrate, and a low temperature forming technique for a polycrystalline silicon film applying an excimer laser crystallizing technique is studied and developed as a temperature reducing means.

When a gate electrode is formed, for example, a process temperature is reduced by using a sputter Al film as the gate electrode. In this manner, although it is possible to use a low-melting-point glass substrate, a new problem is posed. More specifically, a heat treatment temperature for a gate insulating film must be decreased with a decrease in process temperature of the entire manufacturing process, and the quality of the gate insulating film is deteriorated. In this manner, the gate insulating film and the gate electrode (Al) easily react to each other and therefore, if a reduction in thickness of a gate insulating film is achieved with a reduction in TFT element size and with a reduction in drive voltage, the reliability of the gate insulating film is considerably deteriorated.

Here, a thin film transistor which can solve the problem and which is disclosed in JP(A) 11-307777 is known. The thin film transistor comprises a crystallized silicon thin film having source and drain regions formed on an insulating substrate, a fine crystalline silicon thin film or crystallite silicon thin film formed on the upper portion of a channel region of the crystallized silicon thin film through a gate insulating film, and a gate metal formed on the fine crystalline silicon thin film by a sputtering method. In this case, by using the gate electrode as a mask, the source and drain regions are formed in a self-alignment manner by using an ion implantation method or an ion doping method. The fine crystalline silicon thin film is formed by using a plasma CVD method. In this manner, by using the fine crystalline silicon thin film formed by the plasma CVD method which can obtain a phosphorus-doped layer having a film forming temperature of about 300° C. and a low resistance, the problem described above can be solved.

However, since the fine crystalline silicon thin film, i.e. a crystalline material, is used for the lower layer of the gate electrode, ions implanted or introduced when the source and drain regions are formed causes channeling, and the ions may reach a deeper layer. More specifically, the ions are penetrated through the gate electrode to reach the inner side of the gate insulating film or the inner side of the crystallized silicon thin film, and the transistor characteristics may be deteriorated.

The object of the present invention is to provide a thin film transistor which can solve the problems included in the prior art and can suppress deterioration of transistor characteristics caused by channeling of ions.

SUMMARY OF THE INVENTION

A thin film transistor according to the present invention has a structure comprising a crystallized silicon film having source and drain regions and a channel region which are formed on a substrate, a gate insulating film formed on the crystallized silicon film, and a gate electrode formed on the gate insulating film. In this structure, an amorphous layer and a crystalline layer are formed in the gate electrode.

A method of manufacturing a thin film transistor according to the present invention describes a method of manufacturing a thin film transistor including a step of forming a crystallized silicon film for source and drain regions on a substrate, a step of forming a gate insulating film on the crystallized silicon film, and a step of forming a gate electrode on the gate insulating film. In this case, the step of forming the gate electrode includes a step of forming an amorphous layer and a crystalline layer as constituent elements of the gate electrode.

When the thin film transistor is formed as described above, and when, by using an ion implantation method or an ion doping method, source and drain regions are formed in a self-alignment manner by using the gate electrode as a mask, drawbacks which are concerned in the prior art and which are caused by channeling of ions to be implanted or introduced can be suppressed.

The amorphous layer may be formed on the surface of the gate insulating film, and a crystalline layer may be formed on the amorphous layer. In this case, the gate electrode will be described in detail below. The amorphous layer may be formed of an amorphous material, and the crystalline layer may be formed of a crystalline material. In the manufacturing method, when the amorphous layer is formed on the gate insulating film, the amorphous material is stacked on the gate insulating film in the step of forming the amorphous layer. In the step of forming the crystalline layer, the crystalline material is stacked on the amorphous material. In this case, as the amorphous material and the crystalline material, silicon thin films in which impurity ions such as phosphorous ions, arsenic ions or boron ions are doped can be used. In this manner, drawbacks caused by channeling of ions can be suppressed as described above.

In addition, an amorphous material is formed as an amorphous layer, and thereafter, a laser beam may be irradiated on the amorphous material to form a gate electrode having a crystalline layer formed on the surface of the amorphous material. By forming the gate electrode in this manner, drawbacks caused by channeling of ions can be suppressed.

A silicon thin film may be formed as a constituent element of the gate electrode, and the silicon thin film may comprise an amorphous layer and a crystalline layer. As the manufacturing method, a film forming time of the silicon thin film is controlled in the step of forming the silicon thin film. For example, when the silicon thin film is formed on the gate insulating film, the film forming time is controlled so that an area near the interface between the silicon thin film and the gate insulating film is made to an amorphous layer and crystallinity changes with the progress of deposition of the silicon thin film to form a crystalline layer on the amorphous layer. In this case, a crystal component in the crystalline layer increases in amount as a distance from the gate insulating film increases. By forming the silicon thin film in this manner, drawbacks caused by channeling of ions can be suppressed.

In addition, annealing at not lower than 300° C. is performed after the silicon thin film is formed, and thereafter a hydrogen introducing process is performed, so that the surface of the silicon thin film can be protected.

After the silicon thin film formed as described above is patterned, source and drain regions are formed in the crystallized silicon thin film by using the silicon thin film as a mask. A laser beam having a predetermined energy density is irradiated. In this manner, the resistances of the silicon thin film and the crystallized silicon thin film are made low, and, at the same time, the source and drain regions can be activated.

BRIEF DESCRIPTION OF THE DRAWINGS

FIG. 3 is a table showing sheet resistances or resistivities of silicon thin films having different thicknesses;

FIG. 4 is tables showing components in the upper layer and the lower layer of the silicon thin film, in which FIG. 4A is a table showing components in the silicon thin film having a thickness of 40.7 nm, FIG. 4B is a table showing components in the silicon thin film having a thickness of 68.5 nm and FIG. 4C is a table showing components in the silicon thin film having a thickness of 104.6 nm;

FIGS. 9A to 9E are views showing the steps in manufacturing a thin film transistor according to this embodiment, and are views showing the manufacturing steps performed in this order;

FIGS. 12F to 12G are views showing the steps in manufacturing a thin film transistor according to this embodiment, and are views showing the steps subsequent to the step of FIG. 9E and showing the manufacturing steps performed in this order;

DETAILED DESCRIPTION OF THE PREFERRED EMBODIMENTS

Figure 1:
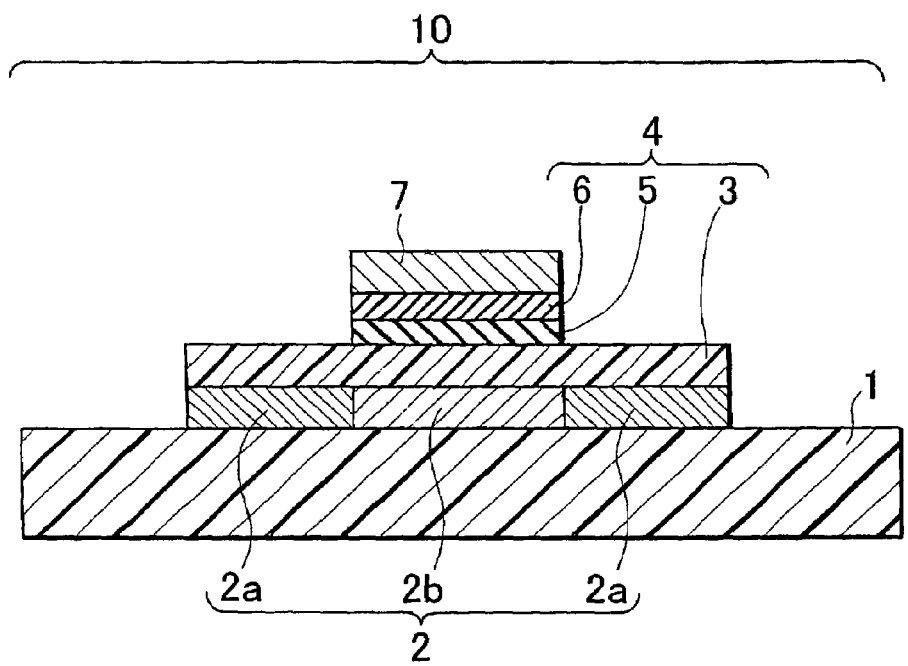
FIG. 1 is a view showing a first embodiment of a thin film transistor according to the present invention.

A first embodiment of the present invention will be described below with reference to FIG. 1. Reference numeral 10 shown in FIG. 1 denotes a thin film transistor.

The thin film transistor 10 comprises a crystallized silicon thin film 2 having source and drain regions 2a and a channel region 2b formed on an insulating substrate 1 as shown in FIG. 1, a gate insulating film 3 formed on the crystallized silicon thin film 2 and constituted by, e.g., a silicon oxide film, and a gate electrode 4 formed on the gate insulating film 3.

In this case, as the insulating substrate 1, a glass substrate is used. In addition, the crystallized silicon thin film 2 is formed by a non-doped (impurity-undoped) film, and the source and drain regions 2a are formed such that impurity ions such as phosphorous ions, boron ions or arsenic ions are implanted or introduced at a high-concentration by using an ion implantation method or an ion doping method to control valence electrons.

The gate electrode 4 comprises a lower gate silicon layer (amorphous layer) 5 formed above the channel region 2b, an upper gate silicon layer (crystalline layer) 6 formed on the lower gate silicon layer 5, and a gate metal 7 formed on the upper gate silicon layer 6 and made of metal or metal silicide. Of these components, an amorphous silicon (amorphous material) in which phosphorous ions are doped in advance is used as the lower gate silicon layer 5, and a crystalline silicon (crystalline material) in which phosphorous ions are similarly doped is used as the upper gate silicon layer 6.

In this manner, since the lower gate silicon layer 5 serving as an amorphous material is formed on the gate insulating film 3 serving as an amorphous material, channeling occurring in the prior art when the source and drain regions 2a are formed can be prevented, and the transistor characteristics can be suppressed from being deteriorated.

In this embodiment, although the glass substrate is used as the insulating substrate 1, a substrate obtained by stacking a substrate cover film (described later) on a glass substrate or a substrate obtained by forming a thermal oxide film on a silicon substrate can also be used. As the crystallized silicon thin film 2, a crystallized silicon thin film in which phosphorous ions, boron ions, or the like serving as a low-concentration impurity ions are introduced to control a threshold value may also be used.

A second embodiment of the present invention will be described below with reference to FIGS. 2A and 2B. Reference numeral 20 shown in FIGS. 2A and 2B denotes a thin film transistor.

Figure 2A:
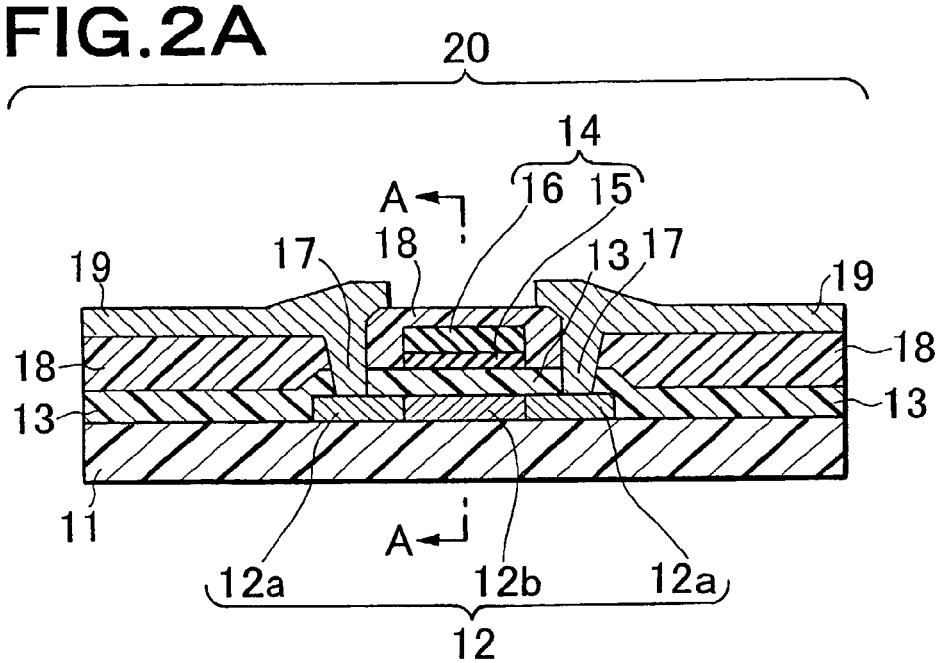
FIG. 2A is a view showing a second embodiment of a thin film transistor according to the present invention.

The thin film transistor 20 comprises a crystallized silicon thin film 12 having source and drain regions 12a and a channel region 12b formed on an insulating substrate 11 as shown in FIG. 2A, a gate insulating film 13 formed on the crystallized silicon thin film 12 and constituted by, e.g., a silicon oxide film, and a gate electrode 14 formed on the gate insulating film 13 and above the channel region 12b.

Figure 2B:
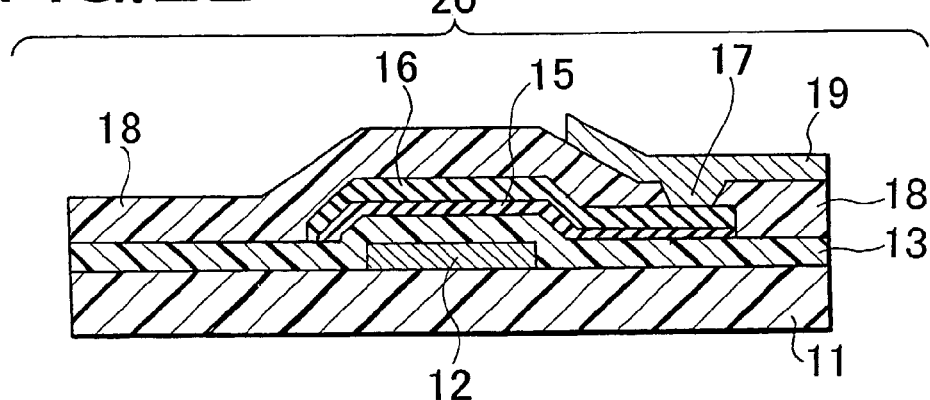
FIG. 2B is a sectional view along an arrow A—A line in FIG. 2A.

In addition, the gate electrode 14 comprises an insulating interlayer 18 formed on the uneven portion of the gate insulating film 13, and a metal wiring layer 19 shown in FIGS. 2A and 2B and made of aluminum buried in contact holes 17 formed in the insulating interlayer 18 and the gate insulating film 13. In this manner, a reduction in wiring resistance can be achieved.

In this case, the gate electrode 14 comprises a lower gate silicon layer (amorphous layer) 15 formed above the channel region 12b, an upper gate silicon layer (crystalline layer) 16 formed on the lower gate silicon layer 15. Of these components, an amorphous silicon (amorphous material) in which phosphorous ions are doped in advance is used as the lower gate silicon layer 15, and a crystalline silicon (crystalline material) in which phosphorous ions are similarly doped is used as the upper gate silicon layer 16.

As the insulating substrate 11, the same insulating substrate as that of the first embodiment is used, and the crystallized silicon thin film 12 and the source and drain regions 12a are formed in the same manner as the first embodiment.

In this manner, since the lower gate silicon layer 15 serving as an amorphous material is formed on the gate insulating film 13 serving as an amorphous material, channeling occurring in the prior art when the source and drain regions 12a are formed can be prevented, and the transistor characteristics can be suppressed from being deteriorated.

In this embodiment, although aluminum is used as the material of the metal wiring layer 19, in place of aluminum, a metal such as copper, tungsten, molybdenum or titanium, an alloy using these metals as a base, or a structure obtained by stacking layers consisting of a plurality of metals can also be used.

In the first and second embodiments, the same effects as those in the respective embodiments can be obtained without forming crystalline silicon serving as the upper gate silicon layers 6 and 16. For example, a laser beam is irradiated on amorphous silicon serving as the lower gate silicon layers 5 and 15, so that the surface layer of the amorphous silicon may be converted into a crystalline layer.

As described above, when the thin film transistors 10 and 20 illustrated in the embodiments described above are arranged, the problem of the prior art can be solved. However, the problem can also be solved by employing the following configuration.

The relationship between the film thickness and the resistivity of a silicon thin film formed on a gate insulating film made of an amorphous material will be described below. As a sample therefor, a glass substrate (amorphous substrate) on which a silicon thin film is formed by using a diode parallel plates RF plasma CVD system is used. In this manner, a result equivalent to the result obtained when a silicon thin film is formed on a gate insulating film can be obtained.

Conditions for forming a silicon thin film in which phosphorous is gas-doped are as follows:

| | |
|---|---|
| substrate temperature | 320° C. |
| flow rate of silane | 20 sccm |
| flow rate of hydrogen | 1000 sccm |
| flow rate of phosphine (diluted with hydrogen at 0.5%) | 40 sccm |
| gas pressure | 50 Pa |
| RF power concentration | 128 mW/cm$^2$ (continuous discharge) |
| typical film formation rate | 3.7 nm/min. |

The film forming time of the silicon thin film is controlled on the basis of the above folding conditions to form three types of samples having different film thicknesses (40.7 nm, 68.5 nm, and 104.6 nm). The sheet resistances for the respective thicknesses are measured, and the sheet resistances are converted into resistivities. The result (relationship between the film thicknesses and the sheet resistances or the resistivities) is shown in FIG. 3. As is apparent from FIG. 3, it is understood that the resistivities decrease as the film thicknesses increase. For this reason, it is suggested that an uneven distribution of resistivities is generated in the direction of the film thickness.

Spectroscopic ellipsometry measurement was performed in consideration of the above results, so that a change in structure in the direction of the film thickness was analyzed by using Bruggeman's Effective Medium Approximation.

In this analysis, the three types of samples described above are used. In this case, surface oxide films having film thicknesses of 3.4 nm, 9.2 nm and 12.7 nm are formed on the surfaces of the silicon thin films having film thicknesses 40.7 nm, 68.5 nm and 104.6 nm, respectively. The analysis result of the sample having the thickness of 40.7 nm is shown in FIG. 4A, the analysis result of the sample having the thickness of 68.5 nm is shown in FIG. 4B, and the analysis result of the sample having the thickness of 104.6 nm is shown in FIG. 4C. Errors on the measurements and the analyses are adjusted by introducing a void component.

In the silicon thin film having the thickness of 40.7 nm, as shown in FIG. 4A, it is understood that an amorphous silicon component is 100% in a 13.1 nm gate silicon layer serving as the lower layer (glass substrate side) and that a crystalline silicon component increases to 14% in a 27.6 nm gate silicon layer serving as the upper layer.

In the silicon thin film having the thickness of 68.5 nm, as shown in FIG. 4B, it is understood that no crystalline silicon component is observed and an amorphous silicon component decreases to 79% in a 27.1 nm gate silicon layer serving as the lower layer and that a crystalline silicon component increases to 49% in a 41.4 nm gate silicon layer serving as the upper layer.

Similarly, in the silicon thin film having the thickness of 104.6 nm, as shown in FIG. 4C, it is understood that no crystalline silicon component is observed and an amorphous silicon component decreases to 70% in a 42.1 nm gate silicon layer serving as the lower layer. It is also understood that a crystalline silicon component increases to 60% in a 62.5 nm gate silicon layer serving as the upper layer.

According to the analysis result of the silicon thin film having the film thickness of 40.7 nm, the 13.1 nm gate silicon layer serving as the lower layer is made of a 100% amorphous silicon component. For this reason, it is estimated that the layers each made of a 100% amorphous silicon component are about 13 nm in the other two types of silicon thin films. For example, the silicon thin film having the thickness of 104.6 nm will be described below. A layer included in a 42.1 nm lower layer, having a thickness of about 13 nm and extending from the glass substrate may consist of a 100% amorphous silicon component, and a crystalline component may gradually increase in a layer having a thickness of about 29 nm which is the remaining layer of the above 42.1 nm lower layer.

Therefore, by controlling the film forming time of the silicon thin film, the lower layer can be made into an amorphous layer, and the upper layer can be made into a crystalline layer. On the basis of this result, other embodiments (third and fourth embodiments) of the thin film transistor according to the present invention will be described later.

A gate electrode layer constituted by a silicon thin film formed by using a plasma CVD method using a gate metal (metal wiring) as described in the first and second embodiments can reduce the wiring resistance thereof also in a large-scale device such as an LCD. However, when higher driving capability is required, and when a reduction in thickness of the gate insulating film and a reduction in channel length are designed, the gate electrode layer also requires a lower resistance. In this case, crystallization is advanced by performing thermal treatment at 600° C. to 1,000° C. In this manner, the low resistance of the gate electrode can be realized. However, in this case, an inexpensive low-melting-point glass (for example, glass melted at 800° C. or more) cannot be used in the substrate.

For this reason, when, on the basis of the following analysis result, embodiments (third and fourth embodiments) of the present invention which can use inexpensive low-melting-point glass or the like in substrates when higher driving capability is required, and a reduction in thickness of a gate insulating film or a reduction in channel length are designed will be described below.

Figure 5:
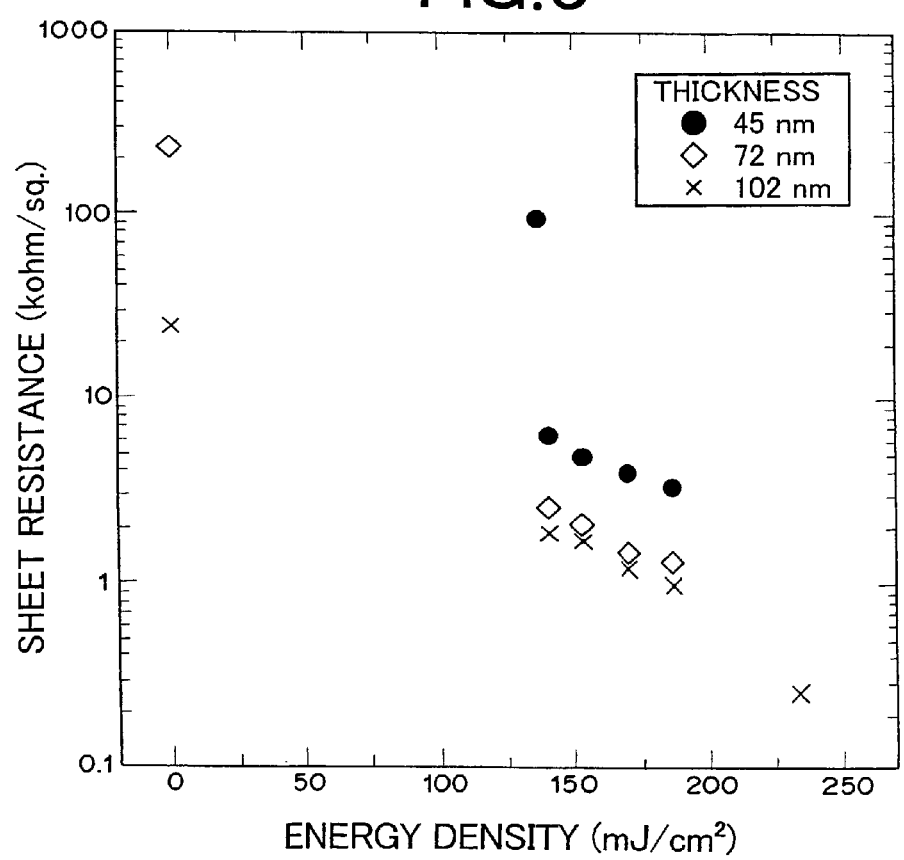
FIG. 5 is graph showing the relationship between energy densities of an excimer laser beam and the sheet resistances of silicon thin films having different thicknesses.

By using samples constituted by silicon thin films having three film thicknesses (45 nm, 72 nm and 102 nm), the relationship between energy densities of an excimer laser beam and the sheet resistances of the silicon thin films are shown in FIG. 5. These silicon thin films were formed by using a plasma CVD method, and recrystallization caused by irradiation of an excimer laser beam was performed while keeping the substrate temperatures at a room temperature to measure the sheet resistances of the silicon thin films. As a result, as shown in FIG. 5, it is understood that the sheet resistance of the silicon thin film decreases in accordance with an increase in energy density of the excimer laser beam. In this case, when the energy density of the excimer laser beam is increased, the films are subjected to ablation by inputting excessive energy. However, it is understood that, the sheet resistance of the silicon thin film having a thickness of 102 nm decreases to 300 Ω/□ when the energy density is 230 mJ/cm$^2$.

Figure 6:
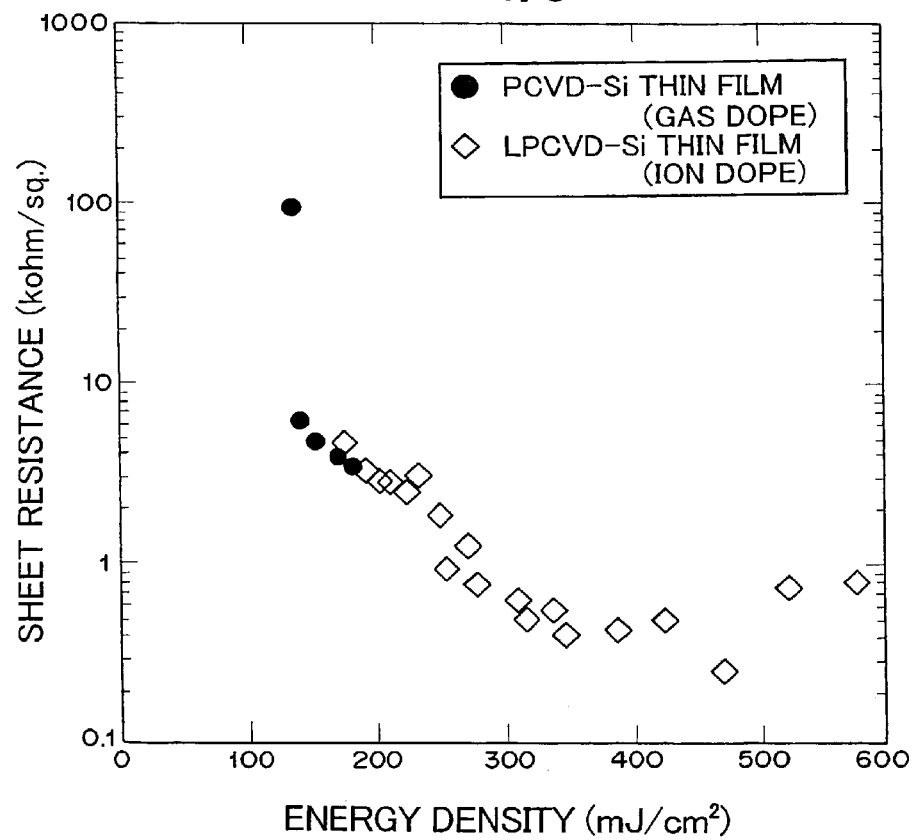
FIG. 6 is a graph showing the relationship between energy densities of an excimer laser in a silicon thin film having a thickness of 50 nm and source and drain regions and the sheet resistance of the silicon thin film and the source and drain regions.
Figure 7:
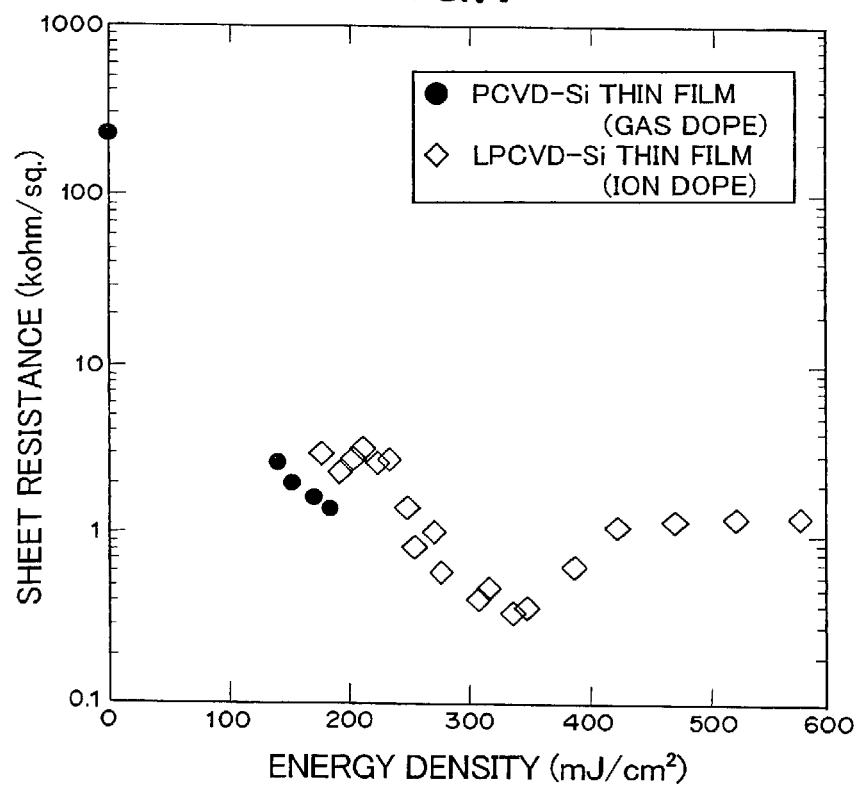
FIG. 7 is a graph showing the relationship between energy densities of an excimer laser in a silicon thin film having a thickness of 75 nm and source and drain regions and the sheet resistance of the silicon thin film and the source and drain regions.

The relationship between energy densities of an excimer laser and sheet resistances of silicon thin films or source and drain regions are shown in FIGS. 6 and 7. FIG. 6 shows a case in which the thicknesses of the silicon thin film and the source and drain regions are each 50 nm, and FIG. 7 shows a case in which the thicknesses of the silicon thin film and the source and drain regions are each 75 nm.

Each of the samples comprises an amorphous silicon layer having source and drain regions formed by using an LPCVD (Low Pressure Chemical Vapor Deposition) method and a silicon thin film (gate silicon layer) formed on the amorphous silicon layer by a plasma CVD method. Here, the source and drain regions are formed in such a manner that phosphorous ions are introduced by an ion doping method using a phosphine gas as a source. In this case, an implantation range in doping is set at almost the center of the film thickness. However, since mass separation is not performed, the ions also include phosphorous ions containing a plurality of atoms, combination ions of phosphorous and hydrogen, hydrogen ions, or the like.

As shown in FIGS. 6 and 7, when the energy density of an excimer laser beam ranges from 130 to 200 mJ/cm$^2$, the gate silicon layer and the source and drain regions have equal resistances, respectively. Therefore, for example, it is apparent that, when the energy density of the excimer laser is set to be 130 to 200 mJ/cm$^2$, a reduction in resistance of each silicon layer and activation of source and drain regions can be simultaneously performed.

The third embodiment of a thin film transistor according to the present invention will be described below with reference to FIG. 8. Reference numeral 30 shown in FIG. 8 denotes a thin film transistor of this embodiment.

Figure 8:
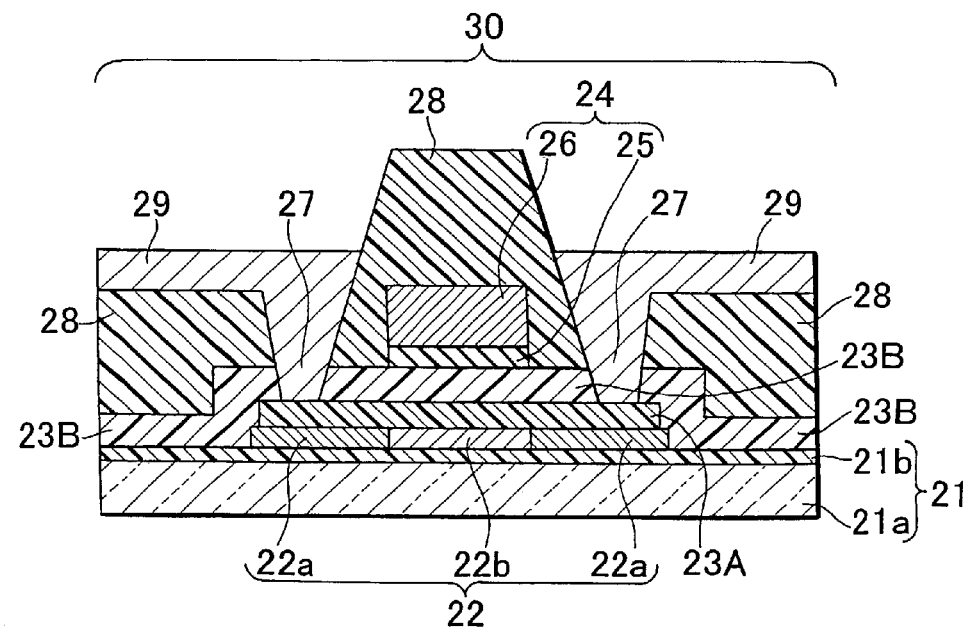
FIG. 8 is a view showing a third embodiment of a thin film transistor according to the present invention.

The thin film transistor 30 comprises a crystallized silicon thin film 22 having source and drain regions 22a and a channel region 22b formed on an insulating substrate 21 as shown in FIG. 8, a first gate insulating film 23A formed on the crystallized silicon thin film 22, a second gate insulating film 23B formed to cover the uneven portion of the substrate, and a gate electrode 24 formed on the second gate insulating film 23B. In addition, the thin film transistor 30 further comprises an insulating interlayer 28 formed on the uneven portion and a metal wiring layer 29 buried in contact holes 27 formed in the insulating interlayer 28 and the second gate insulating film 23B.

In these components, as the insulating substrate 21, an insulating substrate obtained by stacking a substrate cover film 21b made of a CVD oxide film on a glass substrate 21a is used. The first and second gate insulating films 23A and 23B are made of silicon oxide films or nitride films.

The gate electrode 24 comprises a gate silicon layer 25 made of an n$^+$ silicon film (silicon thin film) 25A formed on the surface of the second gate insulating film 23B and above the channel region 22b and a gate metal 27 formed on the gate silicon layer 25. The gate silicon layer 25 is formed to have a thickness of 80 nm. The lower layer part (part extending from the second gate insulating film 23B and having a thickness of about 13 nm) of the gate silicon layer 25 is an amorphous layer, and the upper layer part (the part of the gate silicon layer with the exception of the lower layer part) of the gate silicon layer 25 is a crystalline layer.

In this manner, since the gate silicon layer 25 having an amorphous layer is formed on the first and second gate insulating films 23A and 23B made of an amorphous material, channeling occurring in the prior art when the source and drain regions 22a are formed can be prevented, and the transistor characteristics can be suppressed from being deteriorated.

Figure 10F:
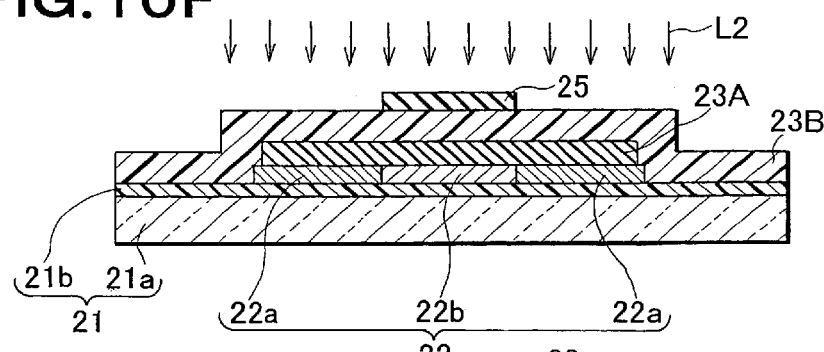
FIGS. 10F to 10H are views showing the steps in manufacturing a thin film transistor according to this embodiment, and are views showing the steps subsequent to the step of FIG. 9E and showing the manufacturing steps performed in this order.
Figure 10G:
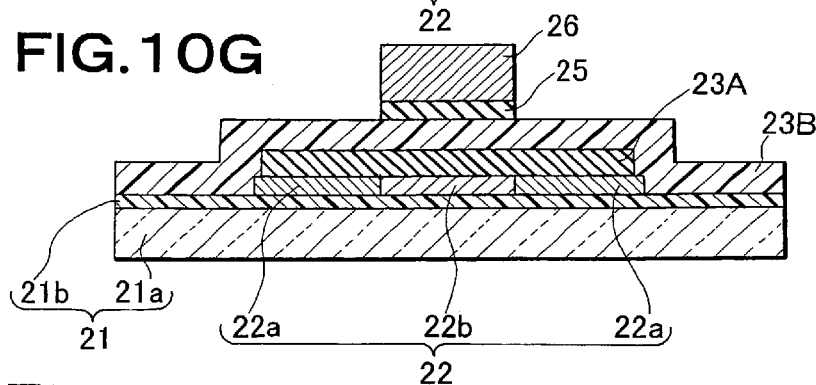
Figure 10H:
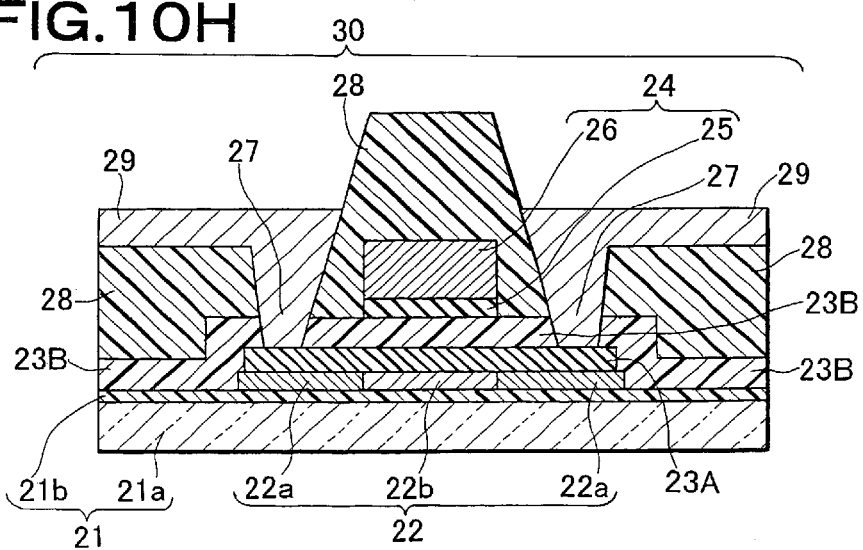

A method of manufacturing the thin film transistor 30 according to this embodiment will be described below with reference to FIGS. 9 and 10. FIGS. 9 and 10 are views showing manufacturing steps performed in the order of FIGS. 9A to 9E and FIGS. 10F to 10H.

The substrate cover film 21b made of a CVD oxide film is stacked on the glass substrate 21a from which organic matters, metals, fine particles and the like are removed by cleaning to thereby form the insulating substrate 21 shown in FIG. 9A The silicon thin film 22A is formed on the insulating substrate 21. Thereafter, the resultant structure is subjected to the cleaning step for removing organic matters, metals, fine particles, a surface oxide film and the like, and is introduced into a thin film deposition system (not shown).

Here, as the substrate cover film 21b, a film which can prevent an impurity contained in a substrate material (glass the alkaline metal concentration of which is made as small as possible, a quartz glass having a polished surface, or the like) and adversely affecting a semiconductor device from being diffused is effective. More specifically, as the substrate cover film 21b of this embodiment, a silicon oxide film is used. The silicon oxide film is formed on the glass substrate 21a at a substrate temperature of 450° C. by using an LPCVD method to have a thickness of 1 μm. In this manner, by using the LPCVD method, the entire surface of the glass substrate 21a with the exception of a held region (for example, the lower surface part of the glass substrate 21a shown in FIG. 9A) can be covered by the silicon oxide film (not shown).

In this case, the substrate cover film 21b (silicon oxide film) can also be formed by using a plasma CVD method using TEOS (tetraethoxy silane) and an oxygen gas as sources, an atmospheric pressure CVD method using TEOS and ozone as sources, or the like.

Subsequently, the silicon thin film 22A is formed at a substrate temperature of 500° C. by an LPCVD method using a disilane gas as a source to have a thickness of 75 nm. In this manner, since the concentration of hydrogen atoms contained in the silicon thin film 22A is 1 atomic % or less, roughness or the like of the silicon thin film 22A caused by hydrogen discharge in the step of irradiating a laser beam L1 (described later) can be prevented.

In this case, the plasma CVD method can be used when the silicon thin film 22A is formed. Even though the plasma CVD method is used as described above, the silicon thin film 22A having a low hydrogen atom concentration can be formed by adjusting the temperature of the insulating substrate 21, a flow rate ratio of hydrogen/silane, and a flow rate ratio of hydrogen/silane tetrafluoride, and the like, to thereby obtain the same effect as that achieved when the LPCVD method is used.

As shown in FIG. 9B, a laser beam L1 is irradiated, the silicon thin film 22A is reformed into the crystallized silicon thin film 22. In this case, laser crystallization is performed in an atmosphere having a high-purity nitrogen of 99.9999% or more at 700 Torr (1 Torr=1.333×10$^2$ Pa). After the irradiation of the laser beam L1 is completed, an oxygen gas is introduced.

In this case, when a hydrogen plasma process is performed before the oxygen gas is introduced, passivation of dangling bond existing in the crystallized silicon thin film 22 can be performed. The hydrogen plasma process can also be performed after the first and second gate insulating film 23A and 23B, the gate electrode 24, the metal wiring layer 29, or the like are formed. However, when a manufacturing step at 350° C. or more is performed, the hydrogen plasma process is performed thereafter, and the temperature of the manufacturing process is preferably kept at 350° C. or less after the hydrogen passivation.

Subsequently, after the gas is exhausted, the resultant structure is conveyed to a plasma CVD chamber (not shown) through a substrate convey chamber (not shown). The first gate insulating film 23A shown in FIG. 9C and made of a silicon oxide film is formed on the crystallized silicon thin film 22. The silicon oxide film is formed at a substrate temperature of 350° C. by using a plasma CVD method using silane, helium and oxygen as source gases to have a thickness of 10 nm. Thereafter, a hydrogen plasma process and heat annealing process are performed if necessary.

An island of stacked films constituted by the crystallized silicon thin film 22 and the first gate insulating film 23A is formed by using photolithography and etching techniques as shown in FIG. 9D. In this case, it is desirable to select an etching condition in which the etching rate of the first gate insulating film 23A is higher than that of the crystallized silicon thin film 22. More specifically, as shown in FIG. 9D, etching is desirably performed in such a manner that the crystallized silicon thin film 22 and the first gate insulating film 23A forms a step-like (or tapered) shape. In this manner, gate leakage can be prevented, and the high-reliable thin film transistor 30 can be provided.

Subsequently, the resultant structure is subjected to the cleaning step for removing organic matters, metals, fine particles and the like, and the second gate insulating film 23B shown in FIG. 9E and made of a silicon oxide film is formed to cover the island described above. The silicon oxide film is formed at a substrate temperature of 450° C. by an LPCVD method using silane and oxygen as sources to have a thickness of 30 nm. The silicon oxide film can also be formed by using a plasma CVD method using TEOS and an oxygen gas as sources or an atmospheric pressure CVD method using TEOS and ozone as sources.

The n$^+$ silicon film 25A having a thickness of 80 nm and shown in FIG. 9E is formed on the second gate insulating film 23B by using a plasma CVD method Thereafter, the n$^+$ silicon film 25A is patterned in such a manner that the n$^+$ silicon film 25A above a portion which will be the channel region 22b remains. In this manner, the gate silicon layer 25 shown in FIG. 10F is formed.

Subsequently, impurity ions are implanted by using the gate silicon layer 25 as a mask to form the source and drain regions 22a. In this case, the source and drain regions 22a are formed by an ion doping method, an ion implantation method, a plasma doping method, a laser doping method, or the like performed without mass separation of impurity ions.

When a CMOS circuit is formed, by also using photolithography, an n-type channel protective film TFT which requires an n$^+$ region or a p-type channel protective film TFT which requires a p$^+$ region are separately formed.

An excimer laser beam L2 is irradiated again. In this manner, the gate silicon layer 25 and the crystallized silicon thin film 22 are reduced in resistance, and, at the same time, the source and drain regions 22a are activated. In this case, since the reflectivity of the excimer laser beam L2 on the surface of the resultant structure changes depending on the thicknesses of the first and second gate insulating films 23A and 23B, the energy density of the excimer laser beam L2 is preferably adjusted to cause the gate silicon layer 25 and the crystallized silicon thin film 22 to have desired resistances. For example, the energy density may be determined on the basis of a desired resistance and energy density characteristics.

When the n$^+$ silicon film 25A is formed by using an LPCVD method, the excimer laser beam L2 having a higher energy density can be irradiated. In this manner, the gate electrode 24 can be more reduced in resistance. In this case, since an n$^+$ silicon film 25A formed by using a plasma CVD method has low ablation threshold strength, the reduction in resistance is more difficult than that of the n$^+$ silicon film 25A formed by using the LPCVD method. For this reason, in this embodiment, although the n$^+$ silicon film 25A is formed by using the plasma CVD method, a silicon material having a higher ablation start strength, e.g. the n$^+$ silicon film 25A formed by the LPCVD method, may be used when a further reduction in resistance of the gate electrode 24 is required.

After a metal film or metal silicide film such as tungsten silicide film having a thickness of 110 nm is deposited to cover the second gate insulating film 23B and the gate silicon layer 25, the metal film or metal silicide film is patterned to leave it above the gate silicon layer 25, so that a gate metal layer 26 is formed as shown in FIG. 10G.

When irradiation of the excimer laser beam L2 is not performed in the previous step, the resultant structure is subjected to a heat treatment at 550° C. After the gate metal layer 26 is formed to activate the source and drain legions 22a. In this case, the heat treatment temperature may be appropriately selected in the range of about 400° C. to 600° C.

After the insulating interlayer 28 is deposited on the uneven portion, the contact holes 27 shown in FIG. 10H are formed by photolithography and etching techniques. After a metal (aluminum) is deposited on the uneven portion, the metal wiring layer 29 is formed by photolithography and etching techniques.

As the insulating interlayer 28, a TEOS-based oxide film which can be designed to be flat is used. In place of the TEOS-based oxide film, a silica-based coating film or an organic coating film may also be used. As the metal wiring layer 29, in place of aluminum, copper, an alloy based on aluminum or copper, or a refractory metal such as tungsten or molybdenum may be used.

The manufacturing steps described above are performed, so that the high-performance high-reliable thin film transistor 30 can be formed.

The fourth embodiment of a thin film transistor according to the present invention will be described below with reference to FIG. 11. Reference numeral 40 shown in FIG. 11 denotes a thin film transistor according to this embodiment.

Figure 11:
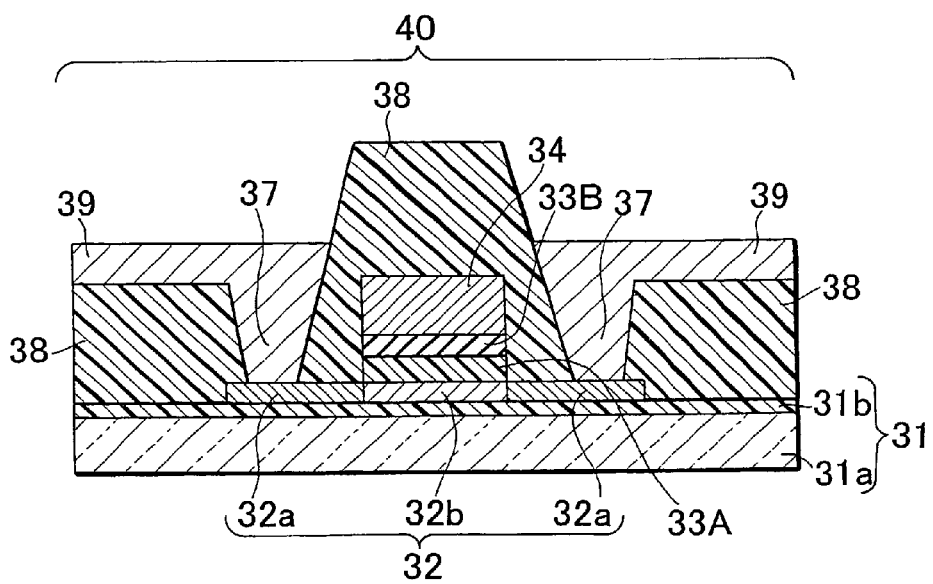
FIG. 11 is a view showing a fourth embodiment of a thin film transistor according to the present invention.

The thin film transistor 40 comprises a crystallized silicon thin film 32 having source and drain regions 32a and a channel region 32b formed on an insulating substrate 31 as shown in FIG. 11, a first gate insulating film 33A formed on the crystallized silicon thin film 32 and above the channel region 32b, a second gate insulating film 33B formed on the first gate insulating film 33A, and a gate electrode 34 formed on the second gate insulating film 33B and formed of an n$^+$ silicon film (silicon thin film) 35A. In addition, the thin film transistor 40 further comprises an insulating interlayer 38 formed on the uneven portion and a metal wiring layer 39 buried in contact holes 37 formed in the insulating interlayer 38.

In these components, as the insulating substrate 31, an insulating substrate obtained by stacking a substrate cover film 31b made of a CVD oxide film on a glass substrate 31a is used. The first and second gate insulating films 33A and 33B are made of silicon oxide films or nitride films.

The n$^+$ silicon film 35A is formed to have a thickness of 80 nm. As in the third embodiment, the lower layer part (part extending from the second gate insulating film 33B and having a thickness of about 13 nm) of the n$^+$ silicon film 35A is an amorphous layer, and the upper layer part (the part of the n$^+$ silicon film with the exception of the lower layer part) of the n$^+$ silicon film 35A is a crystalline layer.

In this manner, since the gate electrode 34 having an amorphous layer is formed on the first and second gate insulating films 33A and 33B made of an amorphous material, channeling occurring in the prior art when the source and drain regions 32a are formed can be prevented, and the transistor characteristics can be suppressed from being deteriorated.

A method of manufacturing the thin film transistor 40 according to this embodiment will be described below with reference to FIGS. 9 and 12. FIGS. 9 and 12 are views showing manufacturing steps performed in the order of FIGS. 9A to 9E and FIGS. 12F to 12G.

The thin film transistor 40 is formed through the same steps (steps shown in FIGS. 9A to 9E) as the manufacturing steps for the thin film transistor 30 according to the third embodiment. Therefore, the subsequent manufacturing steps (the steps shown in FIG. 12F and FIG. 12G will be described below. In this case, in FIG. 9A to FIG. 9E, references numeral 21 is replaced with 31, reference numeral 21a is replaced with 31a, reference numeral 21b is replaced with 31b, reference numeral 22A is replaced with 32A, reference numeral 22 is replaced with 32, reference numeral 23A is replaced with 33A, reference numeral 23B is replaced with 33B, and reference numeral 25A is replaced with 35A.

After the n$^+$ silicon film 35A shown in FIG. 9E is formed, as shown in FIG. 12(f), the resultant structure is patterned in such a manner that the first and second gate insulating films 33A and 33B above a portion which will be the channel region 32b later and the n⁺ silicon film 35A are left. In this manner, the gate electrode 34 shown in FIG. 12(f) is formed.

Thereafter, impurity ions are implanted by using the gate electrode 34 as a mask to form the source and drain regions 32a. In this case, the source and drain regions 32a is formed by an ion doping method, an ion implantation method, a plasma doping method, a laser doping method, or the like performed without mass separation of impurity ions.

When a CMOS circuit is formed as in the third embodiments by also using photolithography, an n-type channel protective film TFT which requires an n⁺ region and a p-type channel protective film TFT which requires a p⁺ region are separately formed.

An excimer laser beam L2 is irradiated again. In this manner, the gate electrode 34 and the crystallized silicon thin film 22 are reduced in resistance, and, at the same time, the source and drain regions 32a are activated.

Subsequently, after the insulating interlayer 38 is deposited on the uneven portion, the contact holes 37 shown in FIG. 12G are formed by photolithography and etching techniques. After a metal (aluminums) is deposited on the uneven portion, the metal wiring layer 39 is formed by photolithography and etching techniques.

As the insulating interlayer 38, a TEOS-based oxide film which can be designed to be flat is used. In place of the TEOS-based oxide film, a silica-based coating film or an organic coating film may also be used. As the metal wiring layer 39, in place of aluminum, copper, an alloy based on aluminum or copper, or a refractory metal such as tungsten or molybdenum may be used.

The manufacturing steps described above are performed, so that the high-performance high-reliable thin film transistor 40 can be formed.

Figure 13:
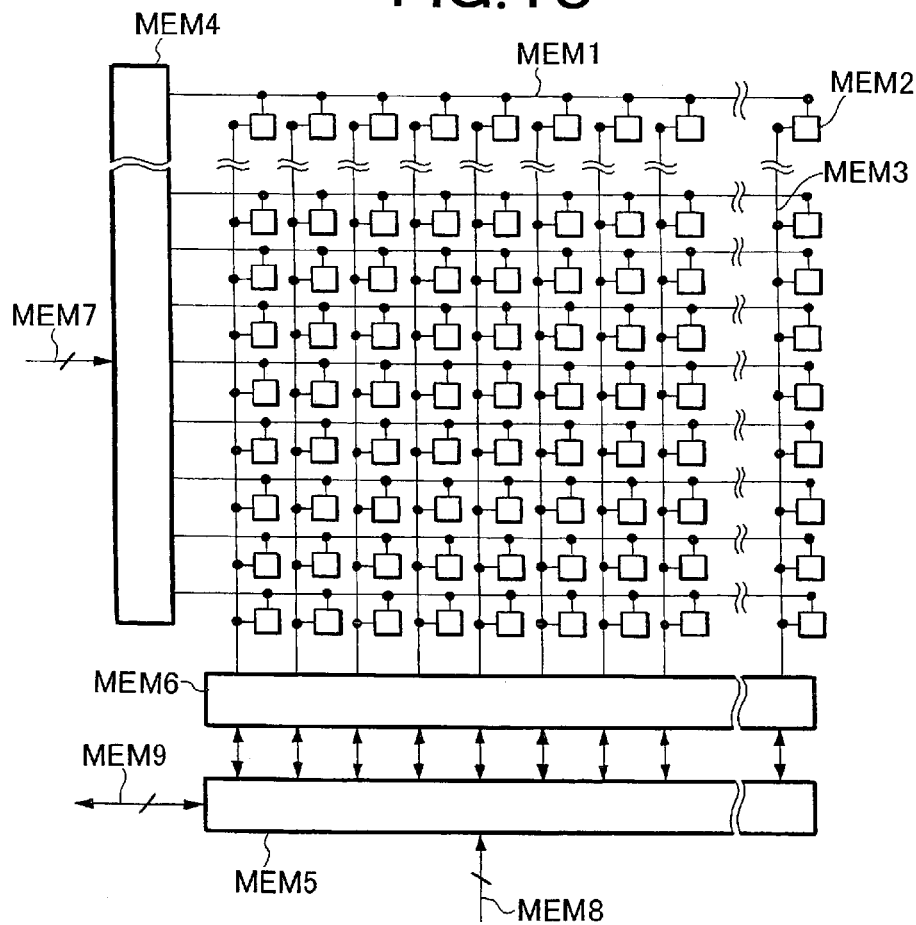
FIG. 13 is a diagram illustrating a case in which thin film transistors according to the present invention are applied to a memory.

A memory array constituted by storage cells MEM2 having $2^n \times 2^m$ bits using thin film transistors according to the embodiments described above is illustrated in FIG. 13. In this memory, a row decoder MEM5 designates one word of $2^m$ bits from $2^n$ words, and a column decoder MEM4 designates $2^k$ bits from the $2^m$ bits of an accessed row. Data MEM9 are transferred to/from an external interface (not shown) by a word line MEM1, a bit line MEM3, an amplifier/driver MEM6, a column address MEM7, and a row address MEM8.

Figure 14:
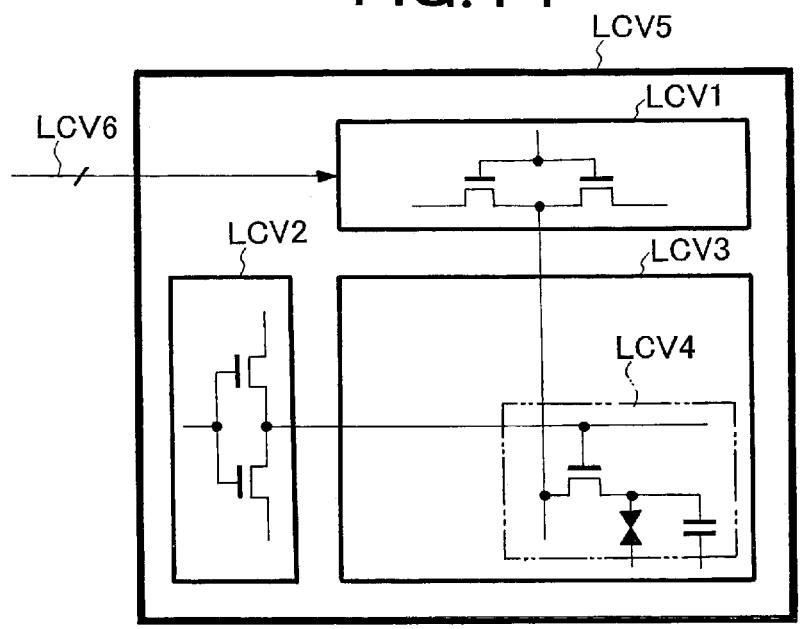
FIG. 14 is a diagram illustrating a case in which thin film transistors according to the present invention are applied to a liquid crystal display device.
Figure 15:
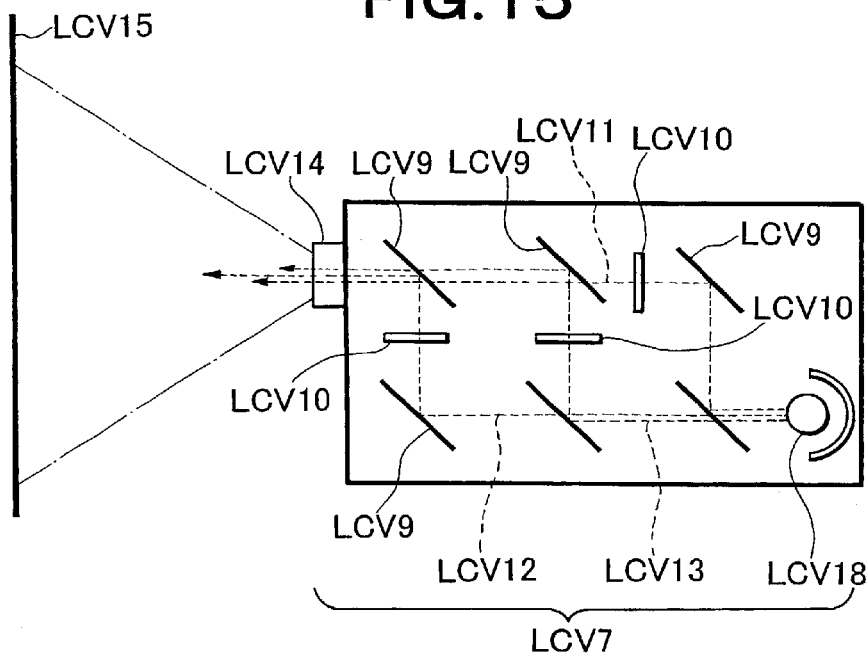
FIG. 15 is a diagram illustrating a case in which thin film transistors according to the present invention are applied to a projector.

Subsequently, a liquid crystal light valve (liquid crystal display LCV5) using thin film transistors according to the embodiments described above is illustrated in FIG. 14, and a projector to which the liquid crystal light valve is applied is illustrated in FIG. 15.

A liquid crystal element (pixel LCV4) is connected to an active matrix array LCV3 and driven by a peripheral drive circuit data driver LCV1 and a gate driver LCV2 as shown in FIG. 14. Video signal data LCV6 is input from the outside and displayed on the respective pixels LCV4.

In a projector LCV7 shown in FIG. 15, light generated by a halogen lamp LCV8 is incident on light valves LCV10 through dichroic mirrors LCV9, and an obtained video image is projected on a screen LCV15 through a projection lens LCV14. In this case, as the light valves LCV10, light valves corresponding to a red component LCV11, a green component LCV12, and a blue component LCV13 of the light are used.

A thin film transistor according to the present invention can also be used to drive an amorphous silicon photodiode. In this case, an image sensor is constituted by an amorphous silicon photodiode, a shift register constituted by a thin film transistor for controlling a main scanning direction, and a read switch. A light source, an image sensor, and a fiber array plate are stacked, so that an original surface image illuminated from the rear surface side of the image sensor is read by using the fiber array plate. A position moving in a sub-scanning direction is read by a roller and an encoder, and a read image signal is supplied to a computer and a recording device through an external circuit formed on a printed board to constitute a portable scanner. In this case, the portable scanner is illustrated. However, the thin film transistor according to the present invention can also be applied to a flat bed scanner, a facsimile, an image sensor of a digital copying machine or the like, and a two-dimensional sensor.

INDUSTRIAL APPLICATION FIELD

In a thin film transistor according to the present invention, an amorphous layer is formed in a gate electrode. For this reason, when source and drain regions are formed in a self-alignment manner by an ion implantation method or an ion doping method with use of the gate electrode as a mask, drawbacks caused by channeling of ions to be implanted or introduced can be suppressed. Therefore, it can be prevented that ions reach a deeper position, i.e., the ions penetrate through the gate electrode to reach the inner side of the gate insulating film or the inner side of the crystallized silicon thin film to form defects, to thereby achieve an element design in consideration of the drawbacks of channeling in the manufacturing process.

In addition, an amorphous material is formed on the gate insulating film, or a silicon thin film having an amorphous layer formed on the interface between the gate insulating film and the silicon thin film is formed. Therefore, when a gate electrode is formed on a gate insulating film serving as an amorphous material, the gate electrode can be stably formed.

Furthermore, after a silicon thin film serving as a gate electrode is patterned, source and drain regions are formed in a crystallized silicon thin film by using the silicon thin film as a mask. By irradiating a laser beam having a predetermined energy density, a novel and excellent thin film transistor which can reduce the resistances of the silicon thin film and the crystallized silicon thin film and can activate the source and drain regions can be obtained.

What is claimed is:

1. A method of manufacturing a thin film transistor, comprising:
   a step of forming a crystallized silicon film for source and drain regions on a substrate;
   a step of forming an amorphous gate insulating film on the crystallized silicon film; and
   a step of forming a gate electrode on the amorphous gate insulating film,
   wherein the step of forming the gate electrode includes a step of forming an amorphous layer and a crystalline layer as constituent elements of the gate electrode, and the amorphous layer and the crystalline layer are formed in this order continuously under a predetermined condition.

2. A method of manufacturing a thin film transistor according to claim 1, wherein the amorphous layer and the crystalline layer are formed by a plasma CVD method.

3. A method of manufacturing a thin film transistor according to claim 1, wherein a laser beam is irradiated after the amorphous layer and the crystalline layer are formed.

4. A method of manufacturing a thin film transistor, comprising:

a step of forming a crystallized silicon film for source and drain regions on a substrate;

a step of forming an amorphous gate insulating film on the crystallized silicon film; and a step of forming a gate electrode on the amorphous gate insulating film, wherein the step of forming the gate electrode includes a step of forming a silicon thin film as a constituent element of the gate electrode, the silicon thin film being formed continuously under a predetermined condition, and forming time of the silicon thin film is controlled so that a portion of the amorphous gate insulating film side of the silicon thin film is formed as an amorphous layer and an opposite portion of the silicon thin film to the amorphous gate insulating film side is formed as a crystalline layer.

5. A method of manufacturing a thin film transistor according to claim 4, wherein annealing at not lower than 300° C. is performed after the silicon thin film is formed, and, thereafter, a hydrogen introducing process is performed.

6. A method of manufacturing a thin film transistor according to claim 4, wherein after the silicon thin film is patterned, the source and drain regions are formed by using the silicon thin film as a mask, and, thereafter, a laser beam is irradiated.

7. The method of claim 1, wherein the predetermined condition includes a substrate temperature, gas flow rate, gas pressure, and RE power concentration that do not change during the step of forming the amorphous layer and the crystalline layer.

8. The method of claim 1, wherein the step of forming the amorphous layer and the crystalline layer includes the step of controlling a time during which the predetermined condition does not change and during which the amorphous and crystalline layers are formed.

9. The method of claim 4, wherein the predetermined condition includes a substrate temperature, gas flow rate, gas pressure, and RF power concentration that do not change during the step of forming the silicon thin film.

10. The method of claim 4, wherein the step of forming the silicon thin film layer includes the step of controlling a time during which the predetermined condition does not change and during which the amorphous and crystalline layers are formed.

11. A thin film transistor, comprising:

a crystallized silicon film having source and drain regions and a channel region which are formed on a substrate;

an amorphous gate insulating film formed on the crystallized silicon film; and a gate electrode formed on the gate insulating film and containing a silicon thin film, wherein the silicon thin film consists of one lower layer formed on the amorphous gate insulating film and one upper layer formed on the lower layer, the lower layer being an amorphous layer and the upper layer being a crystalline layer containing a crystalline silicon component and an amorphous silicon component.

12. A thin film transistor according to claim 11, wherein the lower layer and the upper layer are doped with one of phosphorous ions, arsenic ions and boron ions.

13. A thin film transistor according to claim 11, wherein the gate electrode comprises a gate metal formed on the silicon thin film.

14. A thin film transistor according to claim 13, wherein the gate metal comprises metal silicide.

15. A thin film transistor according to claim 11, wherein the crystalline silicon component increases in amount as a distance from the lower layer increases.

16. A thin film transistor, comprising:

a crystallized silicon film having source and drain regions and a channel region which are formed on a substrate;

an amorphous gate insulating film formed on the crystallized silicon film; and a gate electrode formed on the gate insulating film and containing a silicon thin film, wherein the silicon thin film consists of one lower layer formed on the amorphous gate insulating film and one upper layer formed on the lower layer, the lower layer being an amorphous layer and the upper layer being a crystalline layer containing a crystalline silicon component which increases in amount as a distance from the lower layer increases.

17. A thin film transistor according to claim 16, wherein the lower layer and the upper layer are doped with one of phosphorous ions, arsenic ions and boron ions.

18. A thin film transistor according to claim 16, wherein the gate electrode comprises a gate metal formed on the silicon thin film.

19. A thin film transistor according to claim 18, wherein the gate metal comprises metal silicide.

* * * * *